(12) United States Patent
Pang

(10) Patent No.: US 7,679,099 B2
(45) Date of Patent: Mar. 16, 2010

(54) LOW THERMAL RESISTANCE HIGH POWER LED

(75) Inventor: Siew It Pang, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 582 days.

(21) Appl. No.: 11/566,656

(22) Filed: Dec. 4, 2006

(65) Prior Publication Data

US 2008/0128723 A1    Jun. 5, 2008

(51) Int. Cl.
*H01L 29/22* (2006.01)

(52) U.S. Cl. ................... 257/99; 257/E25.032
(58) Field of Classification Search ................ 257/676, 257/681, 690, 698, 784, E25.032, E51.022, 257/99
See application file for complete search history.

(56) References Cited

U.S. PATENT DOCUMENTS

| | | | | |
|---|---|---|---|---|
| 6,307,259 B1 * | 10/2001 | Asada et al. | ................. | 257/691 |
| 7,019,337 B2 * | 3/2006 | Eden et al. | ................... | 257/107 |
| 7,157,744 B2 * | 1/2007 | Palmteer et al. | ............... | 257/98 |
| 2004/0245591 A1 * | 12/2004 | Wang et al. | ................. | 257/433 |
| 2005/0093116 A1 * | 5/2005 | Palmteer et al. | ............. | 257/676 |

* cited by examiner

*Primary Examiner*—Thao P. Le

(57) ABSTRACT

A light source having a circuit carrier and a die is disclosed. The circuit carrier includes top and bottom conducting layers sandwiching an insulating substrate. The bottom layer has a first surface adjacent to the insulating substrate and a second surface includes a portion of a bottom surface of the light source, the substrate having a die bonding region in which the top conducting layer and a portion of the substrate are absent. A portion of the bottom conducting layer is present under the die bonding region and the die is bonded to the top surface of the bottom conducting layer in the die bonding region. The bottom conducting layer is patterned to provide first and second bottom electrodes that are electrically isolated from one another and connected to first and second contacts for powering the LED.

9 Claims, 4 Drawing Sheets

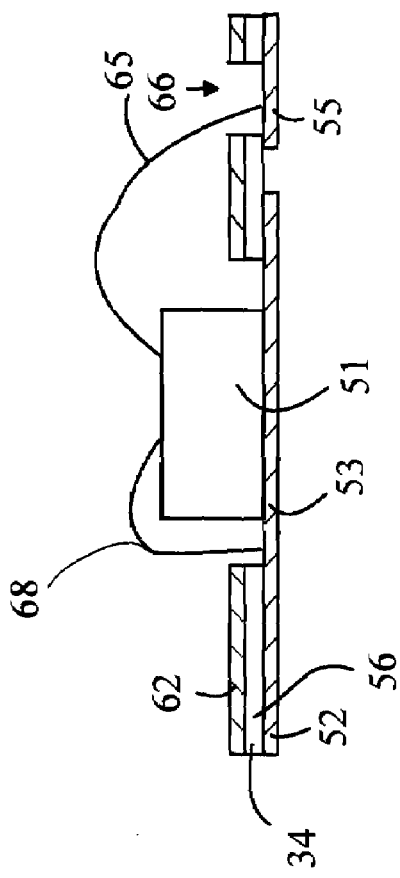
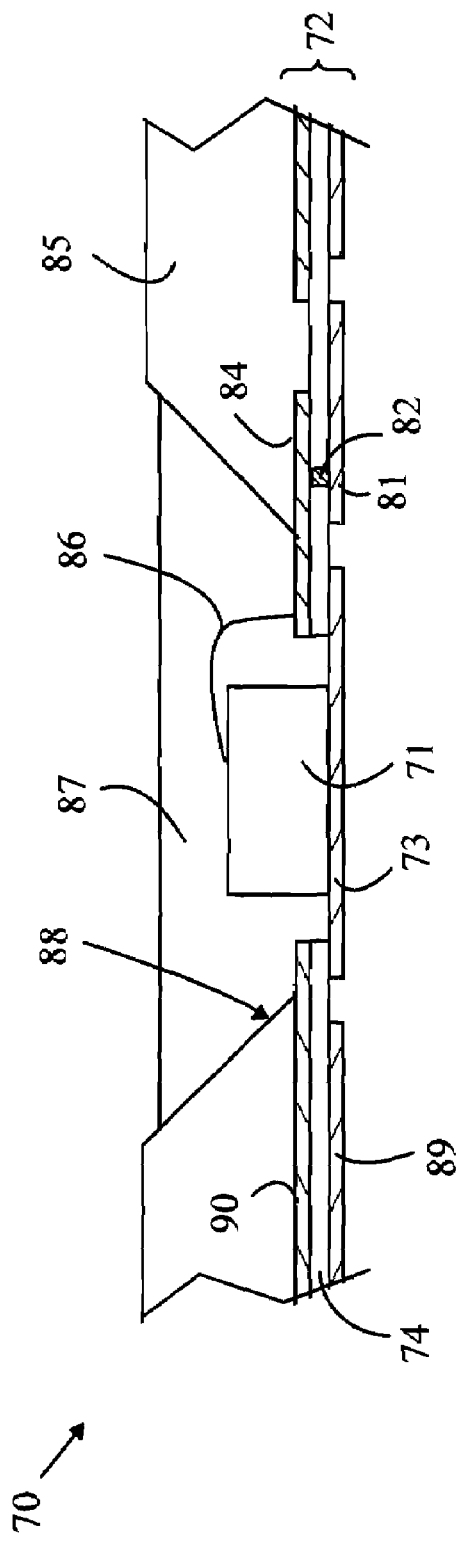

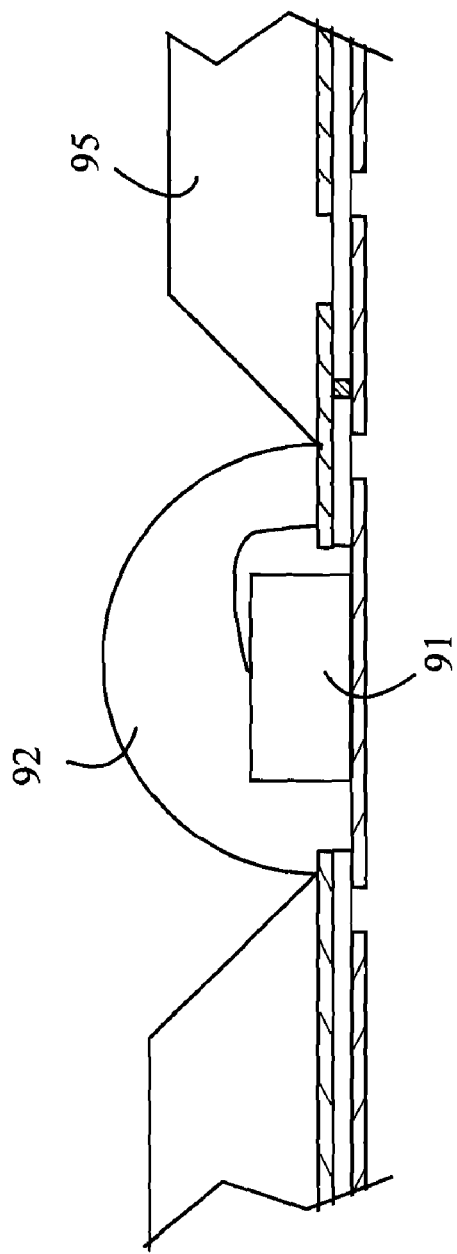
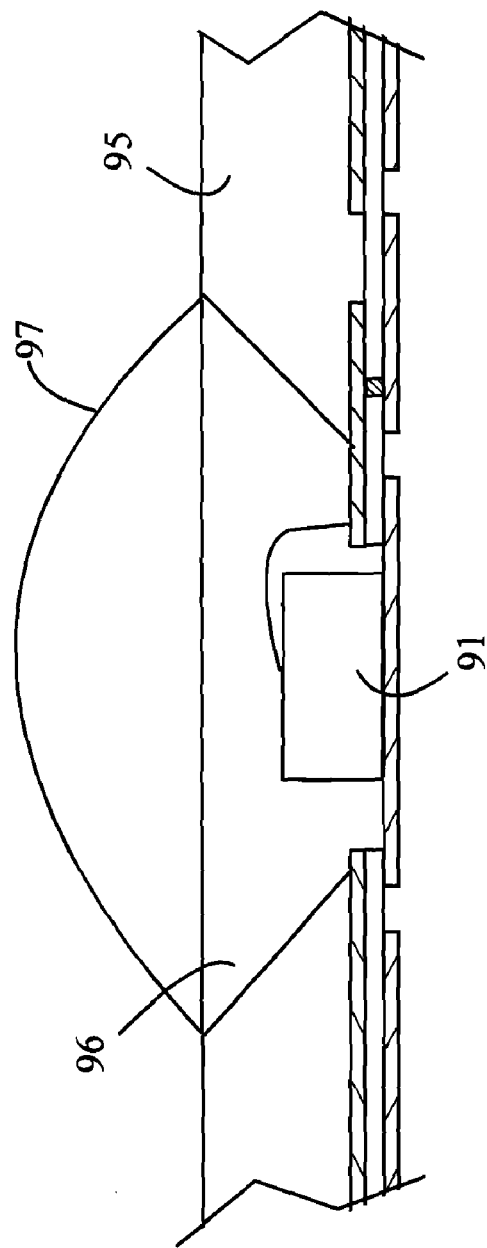

LOW THERMAL RESISTANCE HIGH POWER LED

BACKGROUND OF THE INVENTION

Light emitting diodes (LEDs) are replacing conventional light sources such as fluorescent and incandescent light bulbs in many applications. LEDs have similar electrical efficiency and longer lifetimes than fluorescent light sources. In addition, the driving voltages needed are compatible with the battery power available on many portable devices.

To provide a replacement light source, however, light sources that utilize multiple LEDs are typically required. LEDs emit light in relatively narrow wavelength bands. Hence, to provide a light source of an arbitrary color, arrays of LEDs having different colors are often utilized.

In addition, to provide an LED light source of the intensity available from a conventional light source, multiple LEDs of each color must be included. The maximum light intensity from an LED is typically less than that available from an incandescent light of a few watts. Hence, to provide the equivalent of a 100-watt light bulb, a large number of low power LEDs must be combined in the replacement light source.

To provide a commercial light source, the LED dies must be packaged to protect the dies from the environment and provide structures that increase the amount of light that leaves the LEDs in the desired direction. For example, the narrow emission band limitation of LEDs can be overcome by including a layer of phosphor that converts a portion of the light from the LED to light having a broader spectrum. For example, a blue emitting LED covered by a phosphor that converts blue light to yellow light is perceived as white by a human observer if the phosphor layer is chosen to provide the correct ratio of blue light and yellow light in the light leaving the phosphor layer.

In addition, a significant fraction of the light generated in the LED remains trapped within the LED and is either absorbed or emitted through the side surfaces of the die. Hence, packages that provide reflectors that redirect the light leaving the side surfaces to the forward direction are often utilized. The amount of light that is trapped in the LED can also be reduced by providing a layer of transparent material over the LED in which the outer surface of the layer is approximately spherical in shape.

Heat dissipation is also an important factor in the design of LED light sources that are to replace conventional incandescent light sources. While individual LEDs dissipate only a few watts of power at best, the dies are quite small, and hence, the heat generated is localized in a very small area. If the heat is not efficiently removed, the temperature of the LEDs will increase. Such temperature increases lead to lower conversion efficiencies and lifetimes. Hence, designs that provide some form of heat-conducting path under the LED are preferred.

The above-described packaging considerations all add to the cost of the final light source. Since cost is critical in providing a replacement to low-cost conventional light sources, inexpensive packaging systems that can provide the functions described above are needed.

SUMMARY OF THE INVENTION

The present invention includes a light source having a circuit carrier and a die. The circuit carrier includes top and bottom conducting layers sandwiching an insulating substrate. The bottom layer has a first surface adjacent to the insulating substrate and a second surface includes a portion of a bottom surface of the light source, the substrate having a die bonding region in which the top conducting layer and a portion of the substrate are absent. A portion of the bottom conducting layer is present under the die bonding region. The bottom conducting layer is patterned to provide first and second bottom electrodes that are electrically isolated from one another. The die includes an LED and is bonded to the top surface of the bottom layer in the die bonding region. The die includes first and second contacts for powering the LED, the first and second contacts being electrically connected to the first and second bottom electrodes. The die is covered by a layer of encapsulant. The light source can also include a layer of material bonded to the top conducting layer of the substrate. The layer includes an opening extending through the layer and positioned over the die, the opening having reflective walls that slant outward from the die.

BRIEF DESCRIPTION OF THE DRAWINGS

FIG. 4 illustrates how the connection between one of the contacts on the top of the die and the electrode is provided by a wire bond.

FIG. 6 is a cross-sectional view of light source 70 according to one embodiment of the present invention.

FIG. 7 is a cross-sectional view of another embodiment of a light source according to the present invention.

FIG. 8 is a cross-sectional view of another embodiment of a light source according to the present invention.

DETAILED DESCRIPTION OF THE PREFERRED EMBODIMENTS OF THE INVENTION

Figure 2:
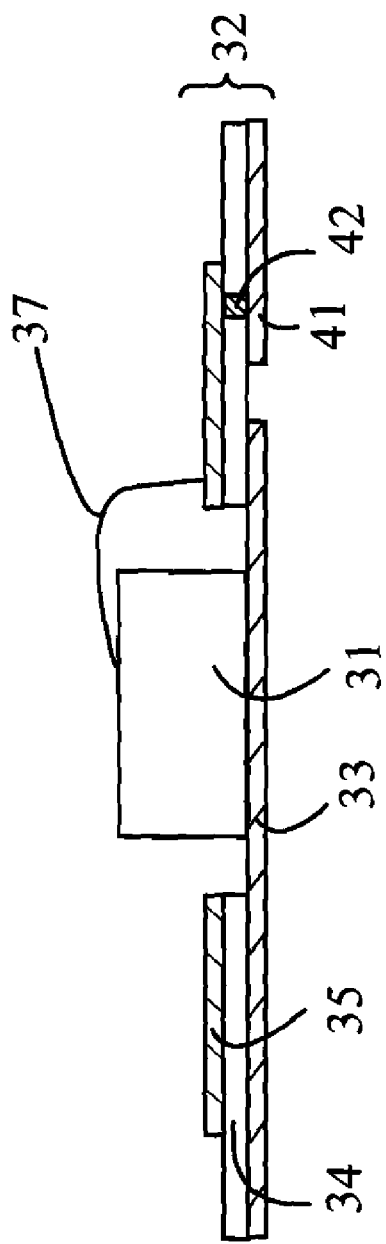
FIG. 2 is a cross-sectional view through line 2-2 shown in FIG. 1.
Figure 1:
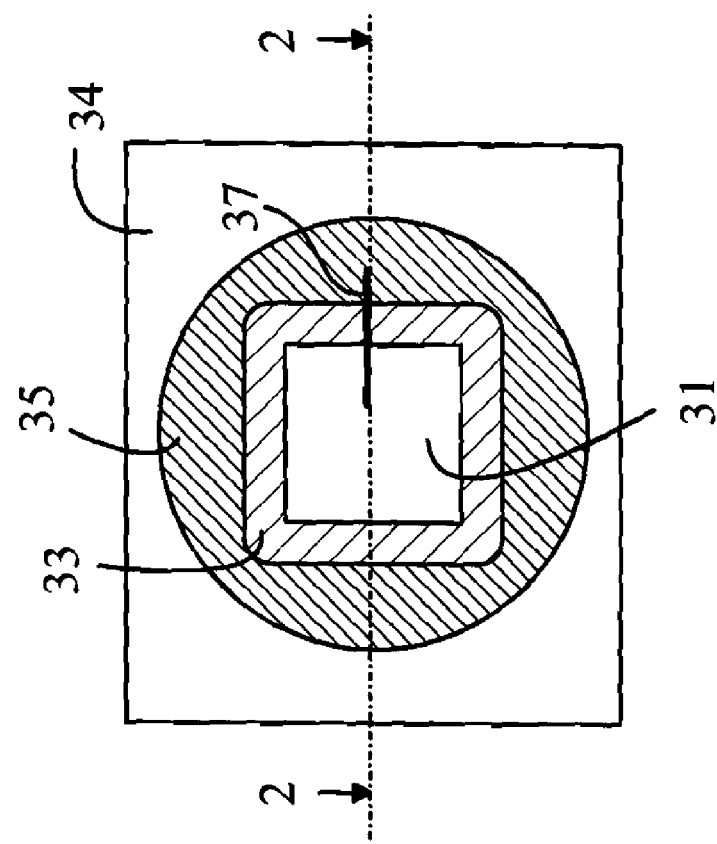
FIG. 1 is a top view of die 31 attached to a substrate.

The manner in which the present invention provides its advantages can be more easily understood with reference to FIGS. 1 and 2, which illustrate the manner in which an LED die is attached to a substrate according to one embodiment of the present invention. FIG. 1 is a top view of die 31 attached to carrier 32, and FIG. 2 is a cross-sectional view through line 2-2 shown in FIG. 1. Die 31 is mounted on a carrier 32. Carrier 32 is constructed from an insulating substrate 34 that has two layers of metal deposited on opposite sides of substrate 34. Both of these layers are patterned to provide the various traces needed to connect and power die 31. Die 31 is mounted on and, connected electrically to, a pad on layer 33, which is used to provide one of the power connections to die 31. The other power terminal of die 31 is on the top of die 31 and is connected to a trace on layer 35 by a wire bond 37. This trace is connected to a trace 41 in layer 33 by a conducting via 42. Trace 41 is electrically isolated from the pad on which die 31 is mounted. Hence, the final light source can be surface mounted on a printed circuit board or the like.

The mounting pad for die 31 is created by removing a portion of metal layer 35 and substrate 34, thus leaving the bottom layer of metal exposed. The portions of the layers in question can be removed using lithographic techniques that are applied to an entire sheet of carrier material so that the mounting pads for a large number of dies can be fabricated together to reduce the cost per die. The metal layers can be constructed from a high thermal conductivity material such as copper. Hence, pad 33 provides a low thermal resistance path to an underlying heat spreading layer on the final printed circuit board on which the light source is mounted.

Substrate 34 is preferably a thermally resistive material that can withstand the temperatures associated with solder reflow utilized in the surface mounting operations. In general, the carrier structure preferably is constructed from a material that can withstand temperatures up to 200° C. (operating temperature) and peak temperature of 320° C. for 10 seconds. Material such as polyimide and bismaleimide triazine, or a fiber-reinforced material can be utilized for the substrate.

In one embodiment, carrier 32 is constructed from a flexible printed circuit carrier. Flexible circuit carriers constructed using polyimide-based insulating layers are available commercially from Dupont. The insulating layer is provided with a copper layer on the top and bottom surfaces thereof. The top and bottom surfaces can be lithographically patterned to provide the various traces in a manner analogous to that used with conventional printed circuit boards. The dielectric layer is preferably between 10 μm and 200 μm. The metal layers are preferably between 2 μm and 200 μm.

Figure 3A:
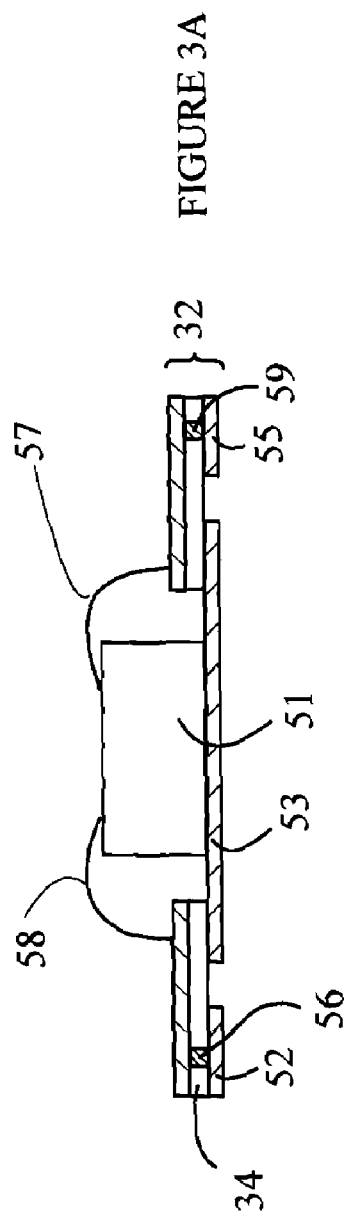
FIG. 3A is a cross-sectional view illustrating another embodiment of a die attached to a circuit carrier according to one embodiment of the present invention.

The above-described embodiments of the present invention utilize an attachment scheme in which one of the power terminals of the die is on the bottom surface of the die and the other is on the top surface. However, embodiments in which both of the power terminals are on the top surface of the die can also be constructed. Refer now to FIG. 3A, which is a cross-sectional view illustrating another embodiment of a die 51 attached to a circuit carrier 32 according to one embodiment of the present invention. The arrangement shown in FIG. 3A differs from that shown in FIGS. 1 and 2 in that die 51 has both power terminals on the top surface thereof. These power terminals are connected to traces in the top metal layer of carrier 32 by the wire bonds shown at 57 and 58. One of these traces is connected to an isolated electrode 52 in the bottom metal layer of carrier 32 by a conducting via 56, and the other trace is connected to a separate isolated layer 55 by another conducting via shown at 59. The die is mounted on a separate isolated pad 53 that is also formed in the bottom metal layer of carrier 32. Pad 53 can be bonded to an appropriate heat-conducting surface on the printed circuit board to which the light source is connected in the final product. Die 51 is preferably mounted on pad 53 utilizing a layer of heat conducting adhesive.

Figure 3B:
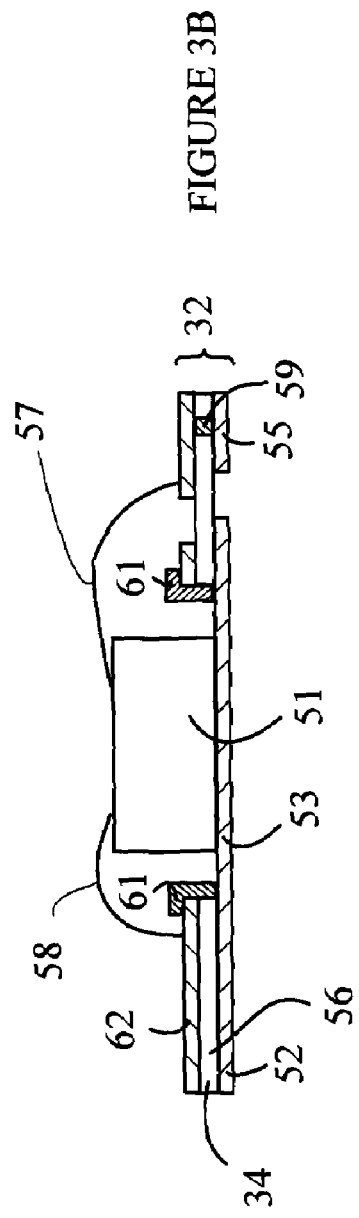
FIG. 3B is cross-sectional view of a die attached to a carrier according to another embodiment of the present invention.

In the above-described embodiments, connections between the top and bottom metal layers utilize metal filled vias. However, arrangements in which the connections are made by plating the edge of the exposed substrate can also be constructed. Refer now to FIG. 3B, which is cross-sectional view of a die attached to a carrier according to another embodiment of the present invention. The arrangement shown in FIG. 3B is similar to that shown in FIG. 3A except that one of the connections to the top of die 51 is made to pad 53 under die 51 with the aid of a plated area 61 that connects trace 62 on the top metal layer to pad 53 on the bottom metal layer. The plated region can be constructed after the portions of layers 34 and the top layer have been removed to provide the opening for mounting die 51. A similar plating strategy could be utilized in place of via 59.

It should also be noted that the connections between the top of die 51 and an electrode formed in the bottom metal layer can be made using wire bonding techniques. Refer now to FIG. 4, which is a cross-sectional view of another embodiment of a die 51 attached to a carrier according to the present invention. In the example shown in FIG. 4, the connection between one of the contacts on the top of die 51 and electrode 55 is provided by a wire bond 65 that connects the contact to electrode 55 through an opening 66 that has been provided in layer 34 and the top metal layer. Similarly, the connection between the other contact on the top of die 51 and pad 53 is provided by a second wire bond 68. This embodiment does not require any metal filled vias.

Figure 5:
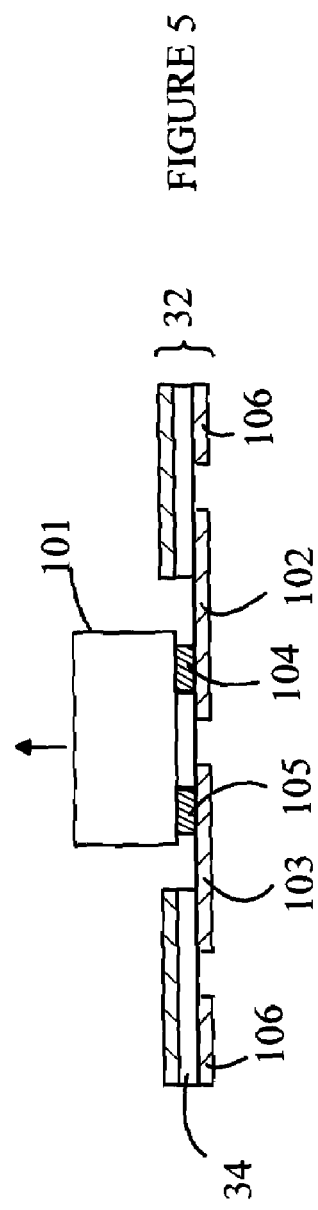
FIG. 5 is another embodiment of a die attached to a carrier according to the present invention.

The above-described embodiments utilize dies in which at least one of the connections to the die must be made by a wire bond that connects to the top surface of the die. However, embodiments that utilize surface mounting dies can also be constructed. Refer now to FIG. 5, which is a cross-sectional view of a surface-mounted die that is mounted on a substrate according to the present invention. Die 101 includes two contacts 104 and 105 on the bottom surface thereof. These contacts are used to power the LED on the die. The LED emits light in the direction shown by the arrow in the drawing. The bottom metal layer 106 of carrier 32 is patterned to provide two corresponding electrodes 103 and 102. The overlap between electrodes 103 and 102 and substrate 34 is chosen to be sufficient to support the electrodes until the die is soldered in place.

As noted above, an LED light source typically utilizes a layer of transparent material over the die and a reflector that redirects light leaving the sides of the LED to the general direction in which the light leaving the top surface of the LED travels. Refer now to FIG. 6, which is a cross-sectional view of a light source 70 according to one embodiment of the present invention. Light source 70 includes an LED 71 that is bonded to a carrier 72 in a manner analogous to that discussed above with respect to FIGS. 1 and 2. Carrier 72 includes an insulating substrate 74 having metal layers 89 and 90 bonded to the bottom and top surfaces, respectively, thereof. The bottom metal layer is patterned to provide mounting pad 73 and electrode 81. Die 71 is powered by applying a potential difference between pad 73 and electrode 81. It is assumed that die 71 has one power contact on the bottom surface thereof and the other power contact on the top surface. The contact on the top surface is connected to electrode 81 by a wire bond 86 that connects the contact to a trace 84 that has been patterned from metal layer 90. Trace 84 is connected to electrode 81 by a metal filled via 82.

Light source 70 also includes a reflector layer 85 that includes a conical opening extending from the top surface of layer 85 to the bottom surface thereof and having reflecting sides 88. In one embodiment, layer 85 is fabricated separately from carrier 72. Both carrier 72 and layer 85 are patterned to include a large number of light sources. Layer 85 is then bonded to the top surface of carrier 72 using a suitable adhesive. Layer 85 could be bonded to carrier 72 either before or after die 71 and the corresponding dies in the other light sources are attached and connected to carrier 72. The conical cavity formed by the hole in layer 85 and the exposed surfaces of carrier 72 is finally filled with a suitable encapsulant 87.

While the embodiment described above utilizes a conical cavity having a circular cross-section, other shapes of reflecting cups can be utilized depending on the specific application. For example, the reflecting cup could have a rectangular cross-section that decreases in size as a function of the distance from the top surface of layer 85.

The encapsulant utilized in the above-described embodiments will, in general, depend on the specific light source being implemented. In general, the encapsulant material should be transparent at the wavelength of light generated by the LED, and should be resistant to damage caused by light of that wavelength. In one embodiment, the encapsulant is introduced into the cavity as a liquid precursor that then sets or is caused to set in place. For example, the encapsulant could be an epoxy resin which is cured by heat or exposure to light of a predetermined wavelength. In another example, the encapsulant is a silicone material that is introduced as a liquid that then sets to a gel or solid form.

For phosphor or luminescent material converted light sources, the phosphor or luminescent material can be placed in the encapsulant. If the phosphor or luminescent material is in powder form, the powder could be suspended in the encapsulant precursor prior to introducing the precursor material into the reflective cup. If the wavelength conversion material is soluble, the material could be dissolved in the precursor material provided a suitable precursor material is utilized.

The precursor material could also include dyes and particles that scatter the light to provide a diffuse light source. Scattering particles are particularly useful in light sources in which a phosphor converts a portion of the light from the die, such that the final light emitted is a combination of the light emitted by the LED and that emitted by the phosphor particles. In addition to converting a portion of the LED light, the phosphor particles scatter some of the light without altering the wavelength of the light. The light from the phosphor particles appears to originate from a diffuse light source that is the size of the encapsulant layer. The light from the LED appears to be emitted from a point source that is scattered by the phosphor particles. If the phosphor particle concentration is too low, these two light sources will appear to have different physical boundaries. As a result, the color of the light perceived by the observer could be different depending on the position of the observer relative to the light source. To avoid this problem, additional diffusing particles that only scatter the light could be introduced into the encapsulant layer so that both light sources now appear to be diffuse light sources having the size of the encapsulant layer.

As noted above, the walls of the reflector redirect light that leaves the sides of the LEDs to the forward direction. In addition, in the case of phosphor converted light sources, the walls also redirect light emitted from the phosphor layer in a sideways direction to the forward direction. If the light source includes phosphor particles or diffusants within the encapsulation layer, the walls of the reflector need not have a "mirror" finish. In these cases, a matte white finish is often sufficient. In such cases, layer 85 can be fabricated from a white plastic. If the walls of the reflector require a mirror finish, a reflecting metallic coating could be applied to the walls.

The embodiment shown in FIG. 6 utilizes an encapsulant layer that has a flat upper surface and a shape defined by the walls of the reflector. However, as noted above, light extraction efficiency can be improved by providing an encapsulant layer having a curved upper surface and an index of refraction that is intermediate between that of the materials from which the LED is constructed and air. Refer now to FIG. 7, which is a cross-sectional view of another embodiment of a light source according to the present invention. Light source 80 is constructed in a manner analogous to that discussed above with respect to light source 70. However, in light source 80, the encapsulant layer 92 is formed as a spherical droplet over die 91. If the encapsulant material does not wet the material from which reflector layer 95 is constructed, the base of the reflector cup and the quantity of encapsulant precursor material dispensed will define the shape and size of the encapsulant layer.

The curved surface could also be provided by molding a second layer of encapsulant material. Refer now to FIG. 8, which is a cross-sectional view of another embodiment of a light source according to the present invention. Light source 90 is constructed in a manner analogous to that described above with respect to light sources 70 and 80. In the case of light source 90, the encapsulant is provided in two steps. First, a layer of encapsulant material 96 is used to fill the reflector cup. Next, a second layer of encapsulant material is molded on top of layer 96 or could be provided in the form of a droplet over the cured first encapsulant layer to create a curved surface 97 that could also provide optical processing of the light.

The above-described embodiments utilize an arrangement in which there is one die in each reflector cup. However, embodiments in which multiple dies are mounted in the same reflector cup could also be constructed.

The reflectors described above can be constructed from a number of metals or alloys thereof such as stainless steel, mild steel, Al, Cu, and Ni. The reflectors could also be constructed from high temperature plastics such as PPA. The reflective coatings can be provided by a metallic coating such as sputtered or vacuum metallization of Al, Cr and Ni. In addition, white "paint" having reflective particles such as $SiO_2$ and $TiO_2$ can also be used to provide a diffused reflector.

The above-described circuit carriers utilize an arrangement having two metal layers bonded to opposite sides of an insulating layer. However, arrangements that include additional layers can also be utilized. For example, an insulating layer could be applied over the top metal layer in selected locations. In addition, additional metal layers separated by insulators could be provided over the top metal layer in which the additional metal layers are patterned to provide additional layers of interconnect in a manner analogous to that utilized in conventional printed circuit boards.

Various modifications to the present invention will become apparent to those skilled in the art from the foregoing description and accompanying drawings. Accordingly, the present invention is to be limited solely by the scope of the following claims.

What is claimed is:

1. A light source comprising:
   a circuit carrier comprising top and bottom conducting layers sandwiching an insulating substrate, said bottom conducting layer having a top surface, a bottom surface, and first and second electrodes that are electrically isolated from each other, wherein a first portion of said top surface of said bottom conducting layer is adjacent to said insulating substrate, and a second portion of said top surface of said bottom conducting layer comprises a die bonding region in which said top conducting layer and said insulating substrate are absent, thereby exposing said top surface of said bottom conducting layer; and
   a die comprising a wire-bonded LED, said die comprising a bottom surface that is bonded to said top surface of said bottom conducting layer in said die bonding region, said die comprising first and second contacts extending therefrom for powering said LED, said first and second contacts being electrically connected to said first and second electrodes of said bottom conducting layer.

2. The light source of claim 1 further comprising a layer of encapsulant covering said die and a layer of material bonded to said top conducting layer, said layer of material comprising an opening extending through said layer of material and positioned over said die, said opening having reflective walls that slant outward from said die.

3. The light source of claim 1 wherein said first contact is connected to a trace in said top conducting layer and said trace is connected to said first electrode in said bottom conducting layer.

4. The light source of claim 3 wherein said trace is connected to said first electrode in said bottom conducting layer by a conductor that passes through said insulating substrate.

5. The light source of claim 3 wherein said trace is connected to said first electrode in said bottom conducting layer by a conductor that is in contact with an edge of said insulating substrate at a boundary of said die bonding region.

6. The light source of claim 1 wherein said second contact is located on a surface of said die that is bonded to said top surface of said bottom electrode and said second electrode comprises a portion of said bottom layer that includes said die bonding region.

7. The light source of claim 1 wherein said first and second contacts are wire bonds that are bonded directly to said first and second electrodes.

8. The light source of claim 2 wherein said encapsulant is deposited from a liquid precursor and wherein said liquid precursor does not wet said reflective walls.

9. The light source of claim 2 wherein said encapsulant comprises silicone.

* * * * *